(12) United States Patent
Schwartz et al.

(10) Patent No.: US 10,768,206 B2
(45) Date of Patent: Sep. 8, 2020

(54) LOOP-BACK PROBE TEST AND VERIFICATION METHOD

(71) Applicant: Integrated Technology Corporation, Tempe, AZ (US)

(72) Inventors: Rodney E. Schwartz, Leander, TX (US); John K. Geist, Scottsdale, AZ (US); Daniel Kosecki, Mesa, AZ (US)

(73) Assignee: Integrated Technology Corporation, Tempe, AZ (US)

( * ) Notice: Subject to any disclaimer, the term of this patent is extended or adjusted under 35 U.S.C. 154(b) by 518 days.

(21) Appl. No.: 15/188,024

(22) Filed: Jun. 21, 2016

(65) Prior Publication Data

US 2016/0377657 A1    Dec. 29, 2016

Related U.S. Application Data

(60) Provisional application No. 62/183,857, filed on Jun. 24, 2015.

(51) Int. Cl.
*G01R 1/067* (2006.01)
*G01R 31/28* (2006.01)

(52) U.S. Cl.
CPC ...... *G01R 1/06794* (2013.01); *G01R 31/2891* (2013.01)

(58) Field of Classification Search
None
See application file for complete search history.

(56) References Cited

U.S. PATENT DOCUMENTS

| | | | | |
|---|---|---|---|---|
| 6,107,816 A | * | 8/2000 | Kearney | G01R 31/1263 324/750.03 |
| 8,248,083 B2 | * | 8/2012 | Inoue | G11B 5/5552 324/537 |
| 8,610,450 B2 | * | 12/2013 | Fukuhara | G01R 31/129 324/762.05 |
| 2005/0017708 A1 | * | 1/2005 | Miller | G01R 35/00 324/750.01 |
| 2008/0134757 A1 | * | 6/2008 | Chen | B81C 1/00587 73/25.05 |
| 2010/0213960 A1 | * | 8/2010 | Mok | G01R 31/2889 324/762.03 |

* cited by examiner

*Primary Examiner* — Paresh Patel
(74) *Attorney, Agent, or Firm* — Kusner & Jaffe

(57) ABSTRACT

A method is provided for using a loop-back test device to verify continuity between loop-back probes electrically connected to each other on a probe card, the loop-back test device including a first conductive region electrically connected to a substrate, a second conductive region electrically isolated from the substrate, the second conductive region spaced apart from the first conductive region such that when a first loop-back probe contacts the first conductive region a second loop-back probe contacts the second conductive region, The method includes placing the first loop-back probe in electrical contact with the first conductive region, and placing the second loop-back probe in electrical contact with the second conductive region. Continuity between the substrate and the second conductive region is then measured.

9 Claims, 4 Drawing Sheets

Contact Dot Area Detail

Backside Reference Dot Detail

LOOP-BACK PROBE TEST AND VERIFICATION METHOD

TECHNICAL FIELD OF THE INVENTION

The present invention relates generally to testing of integrated circuit probe cards, and more particularly, to a method and apparatus for verification of loop-back probe connections.

DESCRIPTION OF THE RELATED ART

Probe cards are used in the testing of integrated circuit and power semiconductor chips in wafer form. The probe card is the interface between the testing apparatus and chips on the wafer. In general, a probe card comprises a plurality of needle like probes arrayed in a pattern to match the connections or bonding pads of an integrated circuit. The probes are typically held in place and connected to a printed circuit board, which provides mechanical stability and connection paths to the test stimuli of equipment used to verify the performance of the integrated circuit. The interface between the probe card and the test equipment may be connectors with corresponding cables, spring "pogo" probes or other types of electrical connection. The same interface is duplicated on probe card analyzers to mechanically support and make contact with the probe card in order to verify proper performance of the probe card itself.

The use of probe card analyzers to verify and test the characteristics of probe cards is well known as documented in U.S. Pat. Nos. 5,657,394 and 6,118,894, each of which is hereby incorporated by reference in its entirety. Parameters such as alignment, planarity, scrub mark, probe tip diameter, leakage, component values and others are tested by modern probe card analyzers. Analyzers are also used to verify that all the interconnections from the tester connection points to the probes are wired correctly. This process is called "wire check" and is routinely performed on new or repaired probe cards. An electrical continuity check is performed on each connection to verify it connects the proper points together and does not connect to other unwanted points. Obviously, this requires that the interconnection is accessible to the probe card analyzer through its electrical connections.

In some applications connections between two points or bonding pads must be completed to properly test the circuit. These connections are typically called "loop-back" connections and the probes used to implement the connections are called loop-back probes. No connection is made between the loop-back probes and the external interface so there is no electrical path or connection from the loop-back probes to the probe card analyzer or test system. This is normally done to reduce loading on sensitive circuits which would disturb the performance of the circuit being tested and hence, the test results. Since there is no connection to the probe card analyzer, these loop-back probes cannot be tested electrically for the normally required parameters using standard test methods.

While alignment, scrub mark and tip diameter may be tested by standard means and planarity can be tested by optical means, the verification that the electrical connection is in place, wired correctly and performing its function properly is not possible with existing equipment and techniques. Since the desired connection between the loop-back probes might not be present or other undesired connections might be present, a method of verifying the proper connections are made is required. This task is now being performed by individuals who manually verify each connection using an Ohm meter. This method is very slow and costly in addition to being subject to human error so an automated solution is very desirable.

SUMMARY

A method and system in accordance with the present disclosure enable integrity verification of loop-back connections on an integrated circuit probe card. Additionally, a method and system in accordance with the present disclosure enable measurement of actual contact resistance of a loop-back connection. Further, a method and system in accordance with the present disclosure enable measurement of the relative planarity of loop-back probes using an electrical contact as an indicator of vertical position. According to one aspect of the disclosure, a device for verifying conductivity of a loop-back connection includes: a probe card analyzer capable of performing standard alignment, planarity and contact resistance tests; a semiconductor wafer or other suitable contact substrate patterned with a metal contact dot of proper size electrically connected to the substrate of a proper size to be contacted by one probe tip within a round insulated area which is subsequently within a field of metal which is not connected to the substrate; metallization deposited on the back of the semiconductor or other substrate making contact to the substrate; a mark or reference point on the back of the wafer or other substrate marking the exact position of the contact dot on the front of the wafer.

According to one aspect of the disclosure, the probe card analyzer comprises a system capable of holding the patterned semiconductor wafer or substrate on a moveable chuck such that the reference mark on the back of the wafer is within the field of view of a video imaging device used by the probe card analyzer to determine the X,Y positions of the probes of an integrated circuit probe card.

According to one aspect of the disclosure, the probe card analyzer comprises a system capable of holding the patterned semiconductor wafer or substrate on a moveable chuck such that a probe with a known X,Y position measured by the alignment test on the probe card under test may be used as a pointer to calibrate the position of the contact dot.

According to one aspect of the disclosure, a method is provided for using a loop-back test device to verify continuity between loop-back probes electrically connected to each other on a probe card, the loop-back test device including a first conductive region electrically connected to a substrate, a second conductive region electrically isolated from the substrate, the second conductive region spaced apart from the first conductive region such that when a first loop-back probe contacts the first conductive region a second loop-back probe contacts the second conductive region, the method including: placing the first loop-back probe in electrical contact with the first conductive region; placing the second loop-back probe in electrical contact with the second conductive region; and measuring continuity between the substrate and the second conductive region.

In one embodiment, measuring continuity includes electrically connecting the conductive substrate to a first measurement terminal of a continuity measurement device, and electrically connecting the second conductive region to a second measurement terminal of the continuity measurement device.

In one embodiment, the method includes using a semiconductor wafer as the loop-back test device.

In one embodiment, the method includes using a chuck of a probe card analyzer as the loop-back test device.

In one embodiment, the loop-back test device further includes a reference mark arranged on a side of the substrate opposite the first conductive region, the reference mark aligned with the first conductive region to indicate a position of the first conductive region, the method including: aligning the loop-back test device on a chuck of a probe card analyzer such that the reference mark is in a field of view of an optical detector of the analyzer; obtaining via the optical detector an image of the reference mark; determining a position of the reference mark within the image; and establishing a position of the first conductive region based on the determined position of the reference mark in the image.

In one embodiment, determining the position of the reference mark comprises digitally capturing a video image of the reference mark.

In one embodiment, determining the position of the reference mark comprises using a pointing device to manually identify a center of the reference mark.

In one embodiment, determining the position of the reference mark comprises using a probe having a known position within an array of probes, and moving the chuck such that the probe having the known position points to the center of the first conductive region.

According to another aspect of the disclosure, a method is provided for using a loop-back test device to verify planarity of loop-back probes arranged on a probe card, the loop-back test device including a first conductive region electrically connected to a substrate, a second conductive region electrically isolated from the substrate, the second conductive region spaced apart from the first conductive region such that when a first loop-back probe contacts the first conductive region a second loop-back probe contacts the second conductive region, the method including: incrementally moving the loop-back test device until the first conductive region contacts the first loop-back probe and the second conductive region contacts both the second loop-back probe and at least one probe different from a loop-back probe; concluding the first and second loop-back probes are in contact with the first and second conductive regions, respectively, based on a continuity test between the first and second loop-back probes; and recording relative to a known position of the at least one probe different from the loop-back probe a position of at least one of the first conductive region or the second conductive region in a plane perpendicular to the probe tips.

According to another aspect of the disclosure, a method is provided for using a probe card analyzer to verify no electrical connections exist between a loop-back probe pair and probes other than the loop-back probe pair do not exist, the loop-back probe pair and the other probes each being arranged on a probe card, and the probe card analyzer including a chuck having a card holding device and an isolation pin arranged over a surface of the chuck, the chuck configured to receive the probe card, the method including: placing the probe card into the card holding device; contacting a first loop-back probe of the loop-back probe pair via the isolation pin such that only a single loop-back probe is in electrical contact with the isolation pin; testing for electrical continuity between the first loop-back probe and the other probes on the probe card; based on the electrical continuity test, determining if the first loop-back probe is not in electrical contact with other probes on the probe card.

According to another aspect of the disclosure, a measurement device is provided for measuring continuity between a plurality of loop-back probes arranged on a probe card, a first loop-back probe of the plurality of loop-back probes spaced apart from a second adjacent loop-back probe of the plurality of loop-back probes by a predetermined and fixed distance, the measurement device including: a conductive substrate; a first conductive region having a first external surface, the first conductive region electrically connected to the substrate; a second conductive region having a second external surface, the second conductive region electrically isolated from the substrate, and wherein the second conductive region is spaced apart from the first conductive region such that when the first loop-back probe contacts the first conductive region the second loop-back probe contacts the second conductive region.

In one embodiment, the first conductive region and the second conductive region are arranged on a first side of the substrate, further comprising a reference mark arranged on a second side of the substrate, the second side of the substrate opposite the first side of the substrate, wherein the reference mark is aligned with the first conductive region to indicate a position of the first conductive region.

In one embodiment, the reference mark comprises a laser mark.

In one embodiment, the reference mark comprises a cross-hair.

In one embodiment, the first and second conductive regions are formed from a metalized layer.

In one embodiment, the metalized layer comprises copper.

In one embodiment, the measurement device includes a conductive layer arranged on a side of the substrate opposite that of the first and second conductive regions, the conductive layer electrically connected to the substrate.

In one embodiment, the first external surface and the second external surface are coplanar.

In one embodiment, the first external surface is below the surface of the second external surface.

In one embodiment, the measurement device includes an insulating layer arranged between the second conductive region and the first conductive region.

In one embodiment, the insulating layer is arranged between the second conductive region and the substrate and at least part of the first conductive region.

In one embodiment, the first conductive region is formed as a contact pad.

In one embodiment, the contact pad is formed as a circular pad.

In one embodiment, the conductive substrate comprises a doped silicon wafer.

According to another aspect of the disclosure, a device for determining the relative planarity of loop-back probes includes: a moveable pin configured to contact a single probe tip of the probe card; a force measurement device operatively coupled to said movable pin, wherein the force measurement device is operative to measure a force applied to the moveable pin; a detection device configured to determine when the measured force is at or exceeds a predetermined threshold.

According to another aspect of the disclosure, a method is provided for using a test device to verify relative planarity of loop-back connected probes arranged on a probe card, the test device including a moveable pin configured to contact a single probe tip of the probe card, a force measurement device operatively coupled to said movable pin, wherein the force measurement device is operative to measure a force applied to the moveable pin, and a detection device configured to determine when the measured force is at or exceeds a predetermined threshold, the method including: incrementally moving the movable pin toward the loop-back connected probes; detecting when a force applied to the movable pin is at or exceeds a predetermined threshold; and recording a position of a tip of the movable pin in a plane perpendicular to a plane of a tip of the loop-back probes.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

In the annexed drawings, like references indicate like parts or features.

DETAILED DESCRIPTION OF EMBODIMENTS

Figure 1:
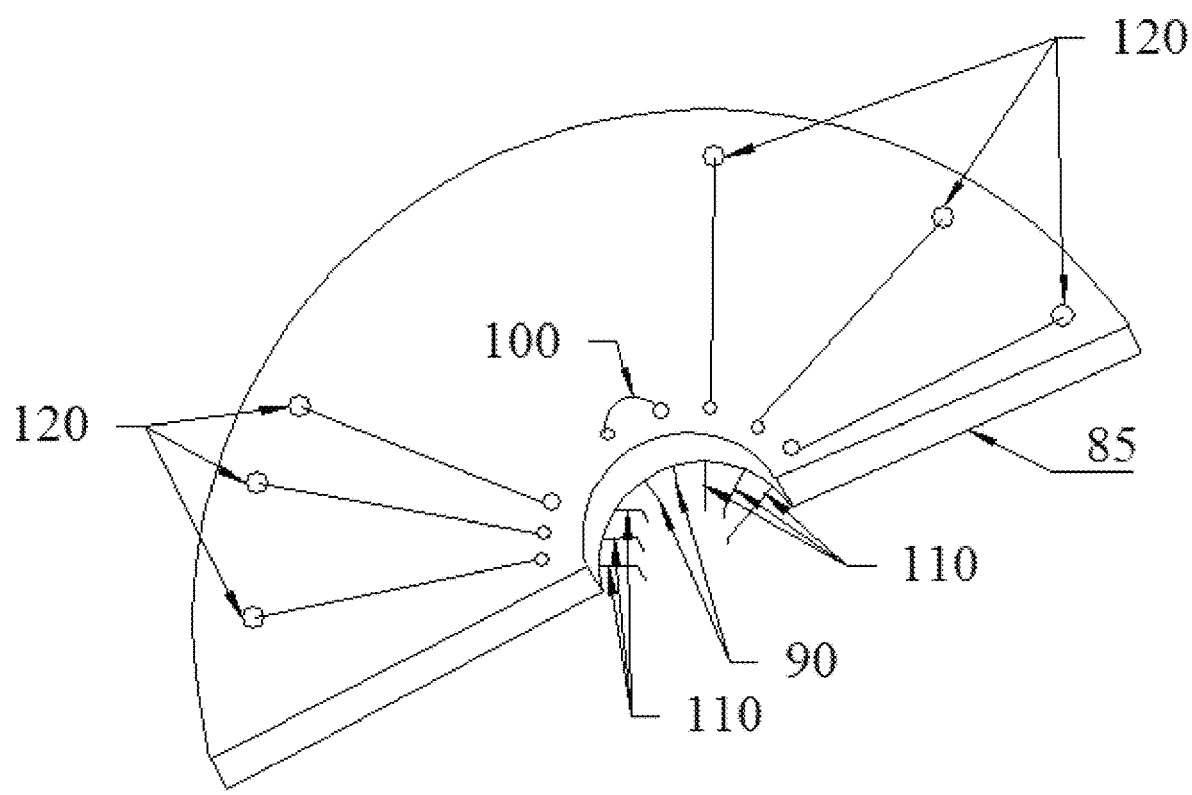
FIG. 1 is a schematic of an exemplary loop-back connection of two probes on an integrated circuit probe card.

Embodiments of the present invention will now be described with reference to the drawings, wherein like reference numerals are used to refer to like elements throughout. It will be understood that the figures are not necessarily to scale.

A typical integrated circuit probe card contains a plurality of probe tips arrayed to match the bonding pad pattern of the chip to be tested. The diameter of the probe tips and the minimum spacing or pitch of the probe tips will be specified at the time of design. With reference to FIG. 1, an exemplary integrated circuit probe card 85 is illustrated, the probe card 85 including normal probe tips 110 and loop-back probes 90, adjacent loop back probes being spaced apart from one another by a predetermined and fixed distance. Test connectors 120 provide a means for connecting the probe tips 110 to a probe card analyzer (not shown).

Figure 2:
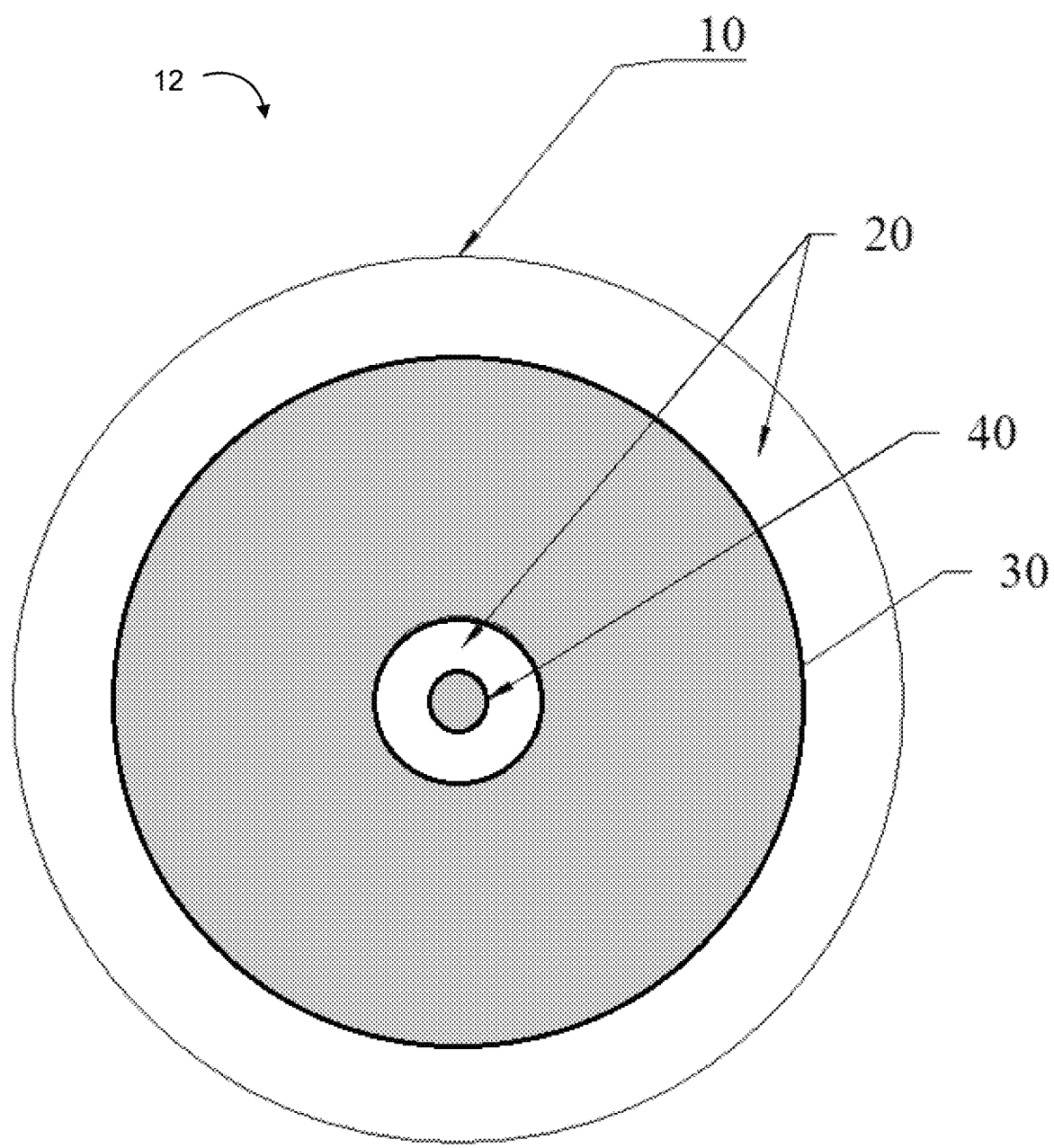
FIG. 2 is an exemplary implementation of the etched metal pattern on the front or top side of a semiconductor wafer or other appropriate contact substrate.
Figure 3:
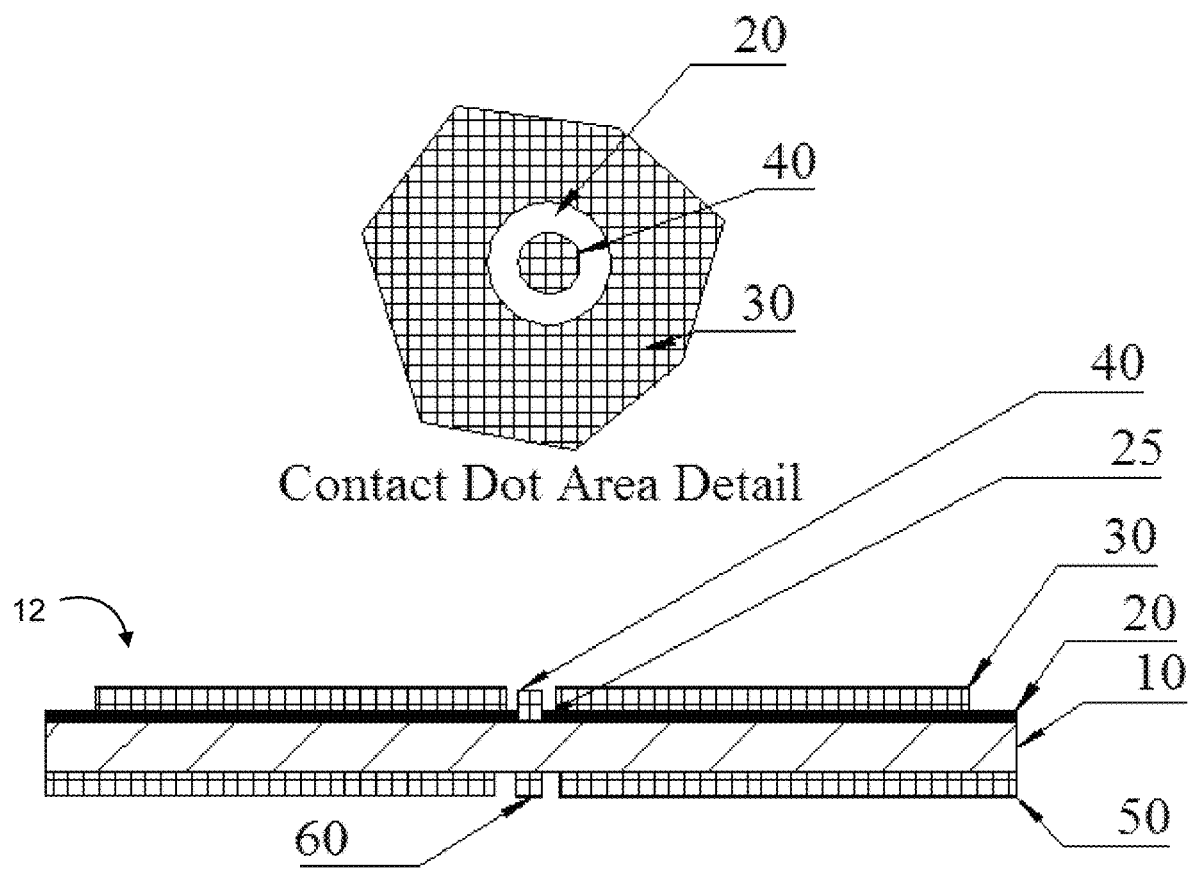
FIG. 3 is an exemplary cross section of the metal pattern on a semiconductor wafer or other appropriate contact substrate showing the location reference mark for the front side contact dot.
Figure 3:
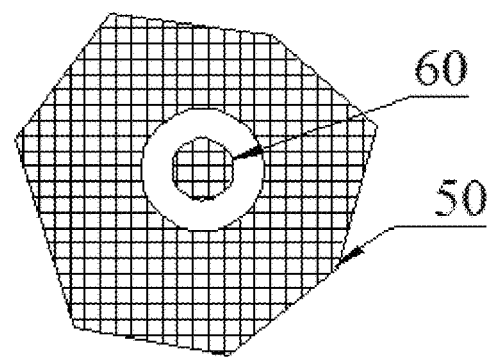

The loop-back probes 90, which may be connected to one or more other loop-back probes 90 via a loop-back path 100, are not connected to other probes tips in the array or to the probe card analyzer. As will be understood by a person having ordinary skill in the art, the position of the loop-back probes 90 in the array of probe tips depends on the application of the probe card 85. For example, some loop-back probes 90 may be side by side at minimum pitch while others may be widely separated in the array. Referring to FIGS. 2 and 3, an exemplary loop-back test device 12 is shown from the top side (FIG. 2) and in cross section (FIG. 3). A substrate 10 can be a semiconductor wafer or other suitable contact substrate. The substrate 10 is designed to enable connections to the loop-back probes 90 in a manner to allow the probe card analyzer to verify the connection path between two or more loop-back probes 90. The substrate 10, which includes metallization patterns 30, 40, 50 and 60, can be produced using well known semiconductor process technology and processes. For example, the substrate 10 may first be doped to be highly conductive. A top surface of the wafer then can be oxidized to form SiO2 layer 20, which is then patterned and etched to create a contact via 25 in the center of the substrate 10. Any oxide formed on a bottom surface of the substrate 10 can be removed by etching. Next, metal such as copper with a titanium barrier layer may be deposited on the top and bottom surfaces of the substrate 10. The top layer of metal then can be patterned to produce the metallization pattern 40 (e.g., a contact dot, pad, or the like), the metallization pattern 40 electrically connected to the substrate 10 (e.g., in the center of the wafer). The metallization pattern 40 forms a first conductive region 40 and the metallization pattern 30 forms a second conductive region 30, the first conductive region 40 isolated from the second conductive region 30 by the SiO2 layer 20. The metallization pattern 30 can be cut back from the edge of the substrate 10 to prevent possible shorting to the bottom metallization pattern 50 (which may be electrically in contact with the substrate 10).

The exact dimensions of the first conductive region 40 and the separation from the second conductive region 30 are determined from the probe tip diameters and spacing or pitch of the probe tips. In this regard, the spacing is such that when a loop-back probe contacts the first conductive region 40, an adjacent loop-back probe contacts the second conductive region 30. The diameter of the first conductive region 40 should be large enough to be easily contacted by one loop-back probe tip but small enough that two loop-back probe tips may not be contacted simultaneously, considering the minimum pitch of the loop-back probe tips 90 on the probe card 85. The metal free oxide area between the first conductive region 40 and the second conductive region 30 should be small enough that when a given loop-back probe is positioned on the first conductive region 40, any other loop-back probe at a minimum pitch dimension from that loop-back probe will be contacting the second conductive region 30. This will ensure that the second probe of a loop-back probe 90 pair will always be contacting the second conductive region 30 when the first probe of a loop-back probe 90 pair is contacting the first conductive region 40.

After the wafer is completed or possibly during the processing, a reference mark 60, e.g., a laser mark or other suitable reference mark such as a dot or cross-hair can be created on the metallization pattern 60 located on the bottom of the substrate 10. The reference mark 60 is arranged on the bottom surface of the substrate 10 in the same relative X,Y position or at a known offset position from the first conductive region 40 (e.g., the laser or other reference mark 60 located on the bottom surface of the substrate 10 is aligned with/corresponds to a location of the contact dot on the top surface of the substrate 10). This reference mark 60 is used to allow the probe card analyzer to position the first conductive region 40 exactly under a probe to be tested.

Figure 4:
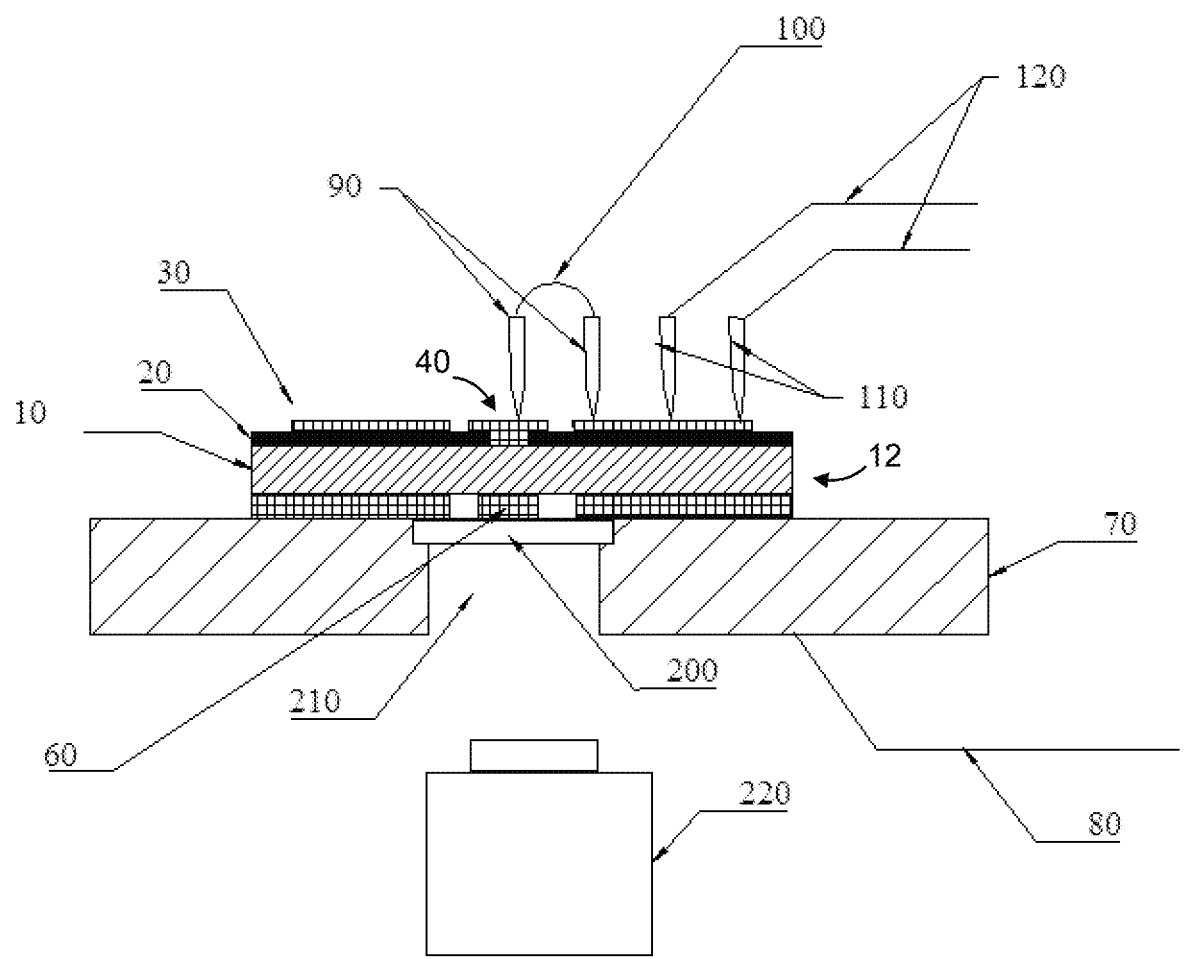
FIG. 4 is a schematic of the test configuration required to verify the continuity of the connection between two loop-back probes.

Referring to FIG. 4, an exemplary video imaging system 220 of the analyzer is positioned under a chuck 70, the chuck 70 having a viewing port through a hole 210 in the chuck 70 and a sapphire window 200 arranged in the chuck 70. The complete description of the operation of the probe card analyzer is covered in U.S. Pat. Nos. 5,657,394 and 6,118,894 and is well known to practitioners in the art. The loop-back test device 12 is positioned on the chuck 70 such that the reference mark 60 is in a field of view of the video system 220. The video system may capture an image (e.g., a digital video image) of the reference mark 60 and automatically determine a position of the reference mark within the image. Alternatively, a user can manually identify the position of the reference mark using, for example, a pointing device (e.g., a mouse, trackball, etc.) or a probe with a known position on the probe card under test. Based on the determined or identified position of the reference mark, the position of the first conductive region 40 on the top surface of the loop-back test device 12 can be determined.

In an alternate embodiment in accordance with the disclosure, the first conductive region 40, second conductive region 30 and isolation between the first and second conductive regions are formed directly in the chuck 70 of the probe card analyzer. This approach is analogous to forming the loop-back test device 12 described above into the chuck 70, but would sacrifice the flexibility of changeable size conductive regions and spacing. Calibration of the position of the first conductive region 40 on the chuck or on the loop-back test device 12 could be accomplished through well-known methods that are already used on probe card analyzers.

A drawback with forming the conductive regions in the chuck 70 is cost and technical difficulty. For example, the maximum dimension of the metal free oxide field between the first and second conductive regions would have to be effective for the minimum pitch of the probe card to be tested. Integrated circuit processing techniques that are compatible with the substrate 10 are typically not available in machined metal processes. Additionally, only one dimension for the first and second conductive regions would be available unless multiple sizes could be accommodated on the chuck 70. Further, the window for viewing the probe tips to perform alignment test is also required to be present in the same structure.

In use, the position of all probes on a probe card 85 may be determined using a standard alignment test performed by the analyzer. Once the probe tip positions are known, the loop-back test device 12 may be positioned on the chuck 70 such that the reference mark is visible to the video capture system 220. The probe card analyzer then positions the reference mark 60 (and thus the first conductive region 40) directly beneath the loop-back probe to be tested, and incrementally moves the loop-back test device 12 until the first conductive region 40 contacts the first probe of the loop-back probes 90 being tested and the second conductive region 30 contacts the other loop-back probe of the pair as well as at least one probe other than a loop-back probe. To verify the connection between the loop-back probes and the first and second conductive regions occurs, a continuity check may be performed. Such continuity check can be from the chuck electrical connection 80 through the substrate 10 to the first conductive region 40, subsequently through the first loop-back probe of the loop-back probes 90 in contact with the first conductive region 40, thence through the loop-back path 100 to the second loop-back probe of the loop-back probes 90, through the second conductive region 30 to any or all the normal connected probes 110 and thence back to the analyzer test connections 120. Continuity between the chuck electrical connection 80 and the analyzer channels as evidenced by current flow verifies the loop-back path 100 is intact. When continuity is first detected, the vertical position of the first and second conductive regions can be recorded. The planarity of the loop-back probe then can be determined based on the location of the first and/or second conductive regions and the known position of the at least one other probe (the position of the at least one other probe is known from the standard planarity test).

Additional testing may be performed to ensure the loop-back probe 90 pair is not connected to any of the normal probe card connections connected to the analyzer. This can easily be determined by performing a standard wire check test using a raised isolation pin to provide isolated contact to one probe tip of the loop-back probe 90 pair on the analyzer and checking for "no connection" between the loop-back probes 90 and all normal probes 110. For example, after placing the probe card into the probe card holding means, a first loop-back probe of the loop-back probe pair is connected to the isolation pin, and then an electrical continuity test is performed between the first loop-back probe and the remaining probes on the probe card. Based on the electrical continuity test, it can be determined if the first loop-back probe is in electrical contact with other the probes on the probe card.

An indication of the Z height or relative planarity of a pair of loop-back probes 90 may be determined in a similar manner to the standard bussed probe planarity test on the probe card analyzer. The first conductive region 40 performs the same function as an isolation pin such as a raised pedestal probe or isolated dot on the analyzer chuck 70. First the normal planarity test is performed on the chuck 70. Next the loop-back test device 12 is loaded on the chuck 70 and individual normal probes are tested for planarity by contact with the first conductive region 40. The difference between the Z height of a normal probe 110 when measured on a surface of the chuck 70 and on the first conductive region 40 is the thickness of the loop-back test device 12. This provides a calibration height to correlate the measurements on the first conductive region 40 directly with the measurements on the chuck 70. The loop-back test device 12 is incrementally moved into contact with the loop-back probe 90 while monitoring for contact via a continuity test as described above. When contact is sensed, the position of the chuck 70 in the Z axis direction is measured and in combination with the calibrated loop-back test device 12 thickness as measured above determines the planarity of the loop-back probe 90 pair relative to all other probes 110 in the array. Since both loop-back probes 90 of a given pair must touch to establish the continuity of the current path, it is not possible to determine the planarity of each loop-back probe 90 separately, only the relative planarity of the pair of probes which will be the higher of the two loop-back probes.

An alternative embodiment of the loop-back test device 12 uses a slightly modified construction for the first conductive region 40. In this embodiment, the substrate 10 would be etched in a way to cause the first conductive region 40 to be below the surface of the second conductive region 30 by a known amount. If the first conductive region 40 is below the second conductive region 30 by at least the maximum planarity distribution of the probe card, the actual planarity of the loop-back probes 90 may be determined using the same method as explained above. Because the first conductive region 40 is below the surface of the substrate 10 when a given loop-back probe of the loop-back probes 90 is tested, all other probes (e.g., loop-back probes 90, and test connectors 120) will have previously contacted the second conductive region 30, thus the actual touch point of the loop-back probe 90 under test can be accurately determined.

Another embodiment in accordance with the disclosure uses a force measurement device coupled to a raised and movable isolation pin capable of contacting an individual probe and sensing the force resulting from the touch. The typical force measuring technique used in probe card analyzers employs a strain gage or load cell force measuring device coupled to a pin sized to contact only one probe at a time. The measuring device is raised above the chuck 70 far enough to ensure no other probes contact the chuck 70. The height of the pin may be calibrated by well-known calibration methods to determine its position relative to the surface of the chuck. This pin effectively isolates the effect of one probe electrically and mechanically and is typically called an isolation pin. As the isolation pin is driven against the probe under test the force exerted by the probe on the isolation pin may be measured. A detection device, such as a comparator or the like, can measure the force applied to the pin and determine when the force is at or exceeds a predetermined threshold (thereby establishing when contact is made between the isolation pin and the loop-back probe). Using the calibrated height of the pin above the chuck, the height of the loop-back probe relative to the other probes in the array may be determined.

Using the same technique of incrementally moving the raised isolation pin into contact with a loop-back probe 90 and sensing when mechanical contact is made by an increase in force may alternatively be used to measure the absolute height of the loop-back probe 90 in the array. Performing the same mechanical planarity measurement on other probes 110 in the array in the vicinity of the loop-back probes 90 allows the loop-back probe 90 height to be accurately fitted into the planarity of the array using the well-known nearest neighbor method. This method assumes that probes 110 in the immediate vicinity of the loop-back probe 90 will be in the same general height range as the tested loop-back probe 90 so their height may be used to relate the height of the loop-back probe 90 to the rest of the array. Alternatively, the entire array of probes may be tested for planarity by the force measurement method, which eliminates the need for nearest neighbor fitting or calibration to the chuck surface to obtain the proper planarity.

Although the invention has been shown and described with respect to a certain embodiment or embodiments, equivalent alterations and modifications may occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein exemplary embodiment or embodiments of the invention. In addition, while a particular feature of the invention may have been described above with respect to only one or more of several embodiments, such feature may be combined with one or more other features of the other embodiments, as may be desired and advantageous for any given or particular application.

What is claimed is:

1. A method of using a loop-back test device to verify continuity between loop-back probes electrically connected to each other on a probe card, the loop-back test device including a first conductive region electrically connected to a substrate, a second conductive region electrically isolated from the substrate, the second conductive region spaced apart from the first conductive region such that when a first loop-back probe contacts the first conductive region a second loop-back probe contacts the second conductive region, the method comprising:

placing the first loop-back probe in electrical contact with the first conductive region;

placing the second loop-back probe in electrical contact with the second conductive region;

placing a third probe of the probe card in electrical contact with the second conductive region, wherein on the probe card the third probe is electrically isolated from the first and second loop-back probes; and measuring continuity between the substrate and the second conductive region via the first loop-back probe, the second loop-back probe and the third probe.

2. The method according to claim 1, wherein measuring continuity includes electrically connecting the substrate to a first measurement terminal of a continuity measurement device, and electrically connecting the second conductive region to a second measurement terminal of the continuity measurement device.

3. The method according to claim 1, further comprising using a semiconductor wafer as the loop-back test device.

4. The method according to claim 1, further comprising using a chuck of a probe card analyzer as the loop-back test device.

5. A method of using a loop-back test device to verify continuity between loop-back probes electrically connected to each other on a probe card, the loop-back test device including a first conductive region electrically connected to a substrate, a second conductive region electrically isolated from the substrate, the second conductive region spaced apart from the first conductive region such that when a first loop-back probe contacts the first conductive region a second loop-back probe contacts the second conductive region, and a reference mark arranged on a side of the substrate opposite the first conductive region, the reference mark aligned with the first conductive region to indicate a position of the first conductive region, the method comprising:

placing the first loop-back probe in electrical contact with the first conductive region;

placing the second loop-back probe in electrical contact with the second conductive region;

measuring continuity between the substrate and the second conductive region;

the loop-back test device further including a reference mark arranged on a side of the substrate opposite the first conductive region, the reference mark aligned with the first conductive, region to indicate a position of the first conductive region, the method comprising:

aligning the loop-back test device on a chuck of a probe card analyzer such that the reference mark is in a field of view of an optical detector of the analyzer;

obtaining via the optical detector an image of the reference mark;

determining a position of the reference mark within the image; and establishing a position of the first conductive region based on the determined position of the reference mark in the image.

6. The method according to claim 5, wherein determining the position of the reference mark comprises digitally capturing a video image of the reference mark.

7. The method according to claim 5, wherein determining the position of the reference mark comprises using a pointing device to manually identify a center of the reference mark.

8. The method according to claim 5, wherein determining the position of the reference mark comprises using a probe having a known position within an array of probes, and moving the chuck such that the probe having the known position points to the center of the first conductive region.

9. A method of using a loop-back test device to verify continuity between loop-back probes having a direct electrical connection to each other on a probe card, the loop-back test device including a first conductive region electrically connected to a substrate, a second conductive region electrically isolated from the substrate, the second conductive region spaced apart from the first conductive region such that when a first loop-back probe contacts the first conductive region a second loop-back probe contacts the second conductive region, the method comprising:
- placing the first loop-back probe in electrical contact with the first conductive region;
- placing the second loop-back probe in electrical contact with the second conductive region; and
- measuring continuity between the substrate and the second conductive region.

* * * * *